United States Patent
Tendulkar et al.

(10) Patent No.: US 9,030,018 B2
(45) Date of Patent: May 12, 2015

(54) TEST VEHICLES FOR EVALUATING RESISTANCE OF THIN LAYERS

(71) Applicants: Mihir Tendulkar, Mountain View, CA (US); David Chi, Los Altos, CA (US)

(72) Inventors: Mihir Tendulkar, Mountain View, CA (US); David Chi, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 370 days.

(21) Appl. No.: 13/624,104

(22) Filed: Sep. 21, 2012

(65) Prior Publication Data

US 2014/0084948 A1 Mar. 27, 2014

(51) Int. Cl.
*H01L 29/40* (2006.01)
*H01L 21/66* (2006.01)
*H01L 23/532* (2006.01)

(52) U.S. Cl.
CPC .......... *H01L 22/34* (2013.01); *H01L 23/53266* (2013.01)

(58) Field of Classification Search
CPC ............... H01L 23/53204; H01L 23/53209; H01L 23/53266

USPC ......................................................... 257/753
See application file for complete search history.

(56) References Cited

U.S. PATENT DOCUMENTS

| 7,127,650 | B2 | 10/2006 | Rios-Baez et al. |
| 7,602,631 | B2 | 10/2009 | Breitwisch |
| 7,807,480 | B2 | 10/2010 | Stine et al. |
| 7,824,935 | B2 * | 11/2010 | Verma et al. .................... 438/18 |
| 7,872,645 | B2 | 1/2011 | Myers |

* cited by examiner

*Primary Examiner* — Chandra Chaudhari

(57) ABSTRACT

Provided are test vehicles for evaluating various semiconductor materials. These materials may be used for various integrated circuit components, such as embedded resistors of resistive random access memory cells. Also provided are methods of fabricating and operating these test vehicles. A test vehicle may include two stacks protruding through an insulating body. Bottom ends of these stacks may include n-doped poly-silicon and may be interconnected by a connector. Each stack may include a titanium nitride layer provided over the poly-silicon end, followed by a titanium layer over the titanium nitride layer and a noble metal layer over the titanium layer. The noble metal layer extends to the top surface of the insulating body and forms a contact surface. The titanium layer may be formed in-situ with the noble metal layer to minimize oxidation of the titanium layer, which is used as an adhesion and oxygen getter.

20 Claims, 9 Drawing Sheets

TEST VEHICLES FOR EVALUATING RESISTANCE OF THIN LAYERS

TECHNICAL FIELD

The present invention relates generally to testing vehicles and more specifically to test vehicles for evaluating resistance characteristics of materials arranged into test samples.

BACKGROUND

Many different materials are considered for semiconductor and related applications because of their resistive and other properties. These materials need to be analyzed to precisely determine their properties and applicability. Often this analysis involves forming test samples from the evaluated materials. The test samples often need to have shapes and/or sizes comparable to actual components of integrated circuits that these materials are considered for. Furthermore, the test samples often need to be tested at conditions (e.g., applied voltages, provided interface materials) that are comparable to ones used in the integrated circuits. Finally, compositional, geometrical, and other variations may result in a great number of possible test samples. For example, resistive random access memory (ReRAM) cells may include multiple layers, such as resistive switching layer, electrodes, embedded resistors, coupling layers, and the like. Each of these layers may be made from a variety of different materials. Performance of individual layers (e.g., varying compositions and thicknesses of each layer) and various combinations of these layers (e.g., varying materials in two adjacent layers) need to be tested. All these present unique challenges for test vehicles.

SUMMARY

Provided are test vehicles for evaluating various semiconductor materials. These materials may be used for various integrated circuit components, such as embedded resistors of resistive random access memory cells. Also provided are methods of fabricating and operating these test vehicles. A test vehicle may include two stacks protruding through an insulating body. Bottom ends of these stacks may include n-doped poly-silicon and may be interconnected by a connector. Each stack may include a titanium nitride layer provided over the poly-silicon end, followed by a titanium layer over the titanium nitride layer and a noble metal layer over the titanium layer. The noble metal layer extends to the top surface of the insulating body and forms a contact surface. The titanium layer may be formed in-situ with the noble metal layer to minimize oxidation of the titanium layer, which is used as an adhesion layer and oxygen getter.

In some embodiments, a test vehicle for evaluating resistance characteristics of test materials formed into test samples includes a connector, a body, and two stacks, each protruding through the body and making an electrical connection to the connector. The connector electrically interconnects the two stacks and includes a conductive material, such as tungsten. The connector may have a predetermined resistance between the stacks, such as between about 5 kOhm and 120 kOhm, such as 9 kOhm, about 62 kOhm, and about 116 kOhm. When multiple test vehicles are provided on the same substrate, some vehicles may have connectors with different resistances. In some embodiments, the two stacks of the same test vehicle are positioned between 1 micrometer and 100 micrometers from each other.

The body includes an insulating material, such as silicon dioxide. Each of the two stacks includes a layer made of titanium and another layer made of a noble metal, such as platinum, iridium, or ruthenium. The thickness of the titanium layer may be between about 20 Angstroms to 70 Angstroms, for example, about 50 Angstroms. The thickness of the noble metal layer may be between about 20 Angstroms to 70 Angstroms, for example, about 50 Angstroms. The noble metal layer extends to the top surface of the body and provides a contact surface.

In some embodiments, each of the two stacks includes another layer provided between the titanium layer and the connector. This other layer may be made from n-doped polysilicon. Furthermore, each stack may also include a titanium nitride layer provided between the titanium layer and the n-doped polysilicon layer.

In some embodiments, each stack has a height of between about 200 nanometers and 1,000 nanometers. Generally, this height corresponds to the thickness of the body. In some embodiments, the contact surface of at least one stack has a dimension of between about 100 nanometers and 600 nanometers within the plane of the substrate (i.e., substantially perpendicular to the height of the stack). This dimension may represent a length of a side of a square or a diameter of a circle. The two stacks of the same test vehicle may have differently sized contact surfaces. Furthermore, a substrate may have multiple test vehicles with differently sized contact surfaces.

In some embodiments, the test vehicle includes two contact pads provided over each of the contact surfaces. A first contact pad may directly interface with a first of the contact surfaces, while a second contact pad may be positioned over a test sample formed from a test material. The test sample is provided between this second contact pad and the second contact surface. The test sample may have dimensions comparable to a corresponding IC component (e.g., the thickness of a test sample may be comparable to the thickness of an embedded resistor). The test sample may extend beyond the boundaries of the corresponding contact surface, which means that the area of this contact surface determines the interface between these two components. Dimensions of the contact pads may be between about 1 micrometer and 100 micrometers within the plane substantially perpendicular to the height of the stack. These dimensions are sufficient to make external electrical connections to the contact pads, such as with probes during actual resistance measurements.

Provided also is a die including a substrate, a first test vehicle, and a second test vehicle. Each test vehicle includes two stacks, each stack having a first layer and a second layer. The first layer may be made from a noble metal, while the second layer may be made from titanium. The first layers of each stack provide corresponding contact surfaces. The two stacks of the first test vehicle are interconnected with a first connector. The two stacks of the second test vehicle are interconnected with a second connector. The first connector may have a different resistance than the second connector. In some embodiments, at least one contact surface of the first test vehicle has a different area a contact surface of the second test vehicle.

Provided also is a method of forming a test vehicle for evaluating resistance characteristics of materials. The method may involve providing a substrate into a processing chamber and forming a titanium layer on the substrate. Without breaking vacuum in the processing chamber, another layer including a noble metal is formed over the titanium layer, such that the noble metal layer caps the titanium layer. The method may proceed with etching portions of the two layers thereby forming two stacks. The two stacks are electrically connected by a connector provided in the substrate. The method then proceeds with filling the space between the two stacks with an insulating material. The top surfaces of the two stacks are exposed and form contact surfaces of the test vehicle.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figure 1A:
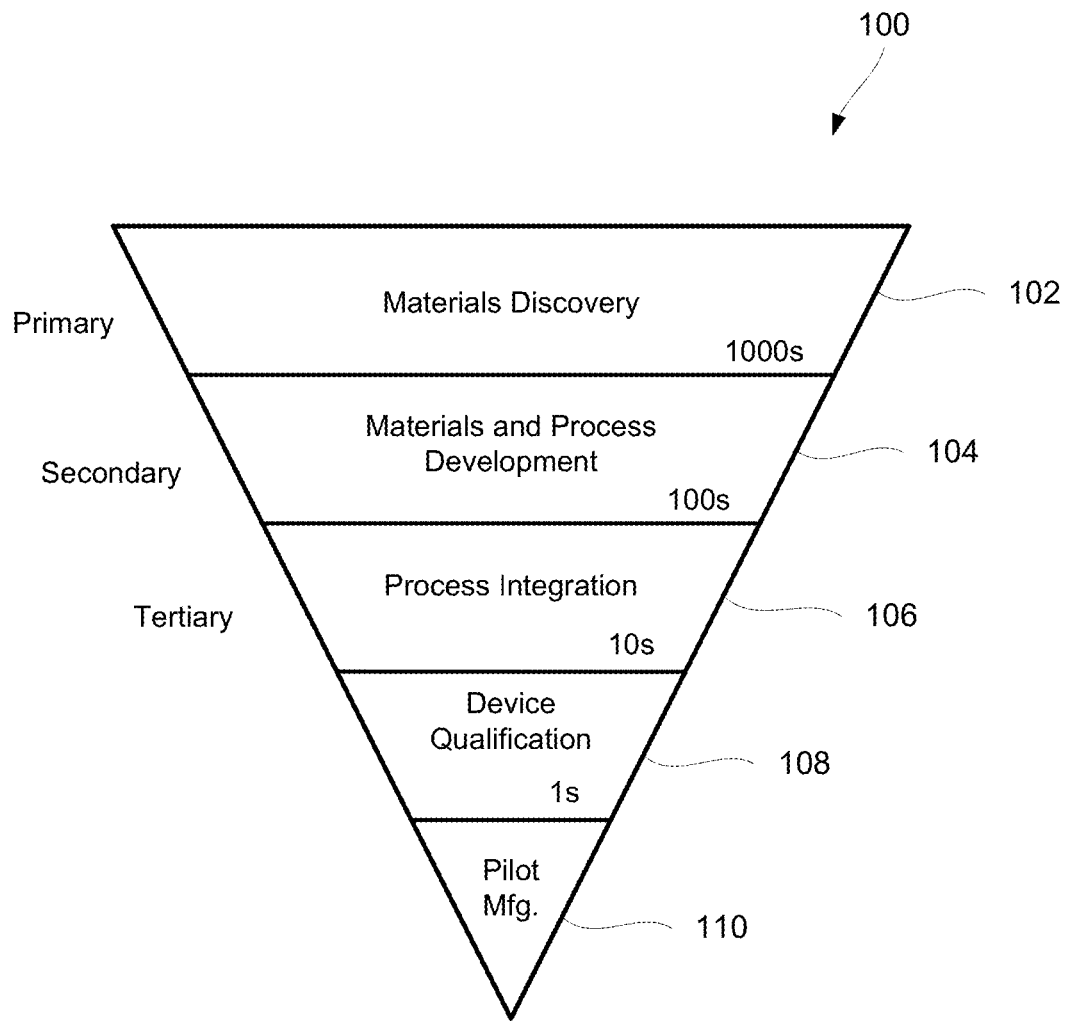
FIG. 1A illustrates a schematic diagram of combinatorial processing and evaluation using primary, secondary, and tertiary screening, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

Screening semiconductor materials often require special test vehicles that allow imitating certain characters of integrated circuits and generating representative test results. For example, test samples made from tested materials may need to be comparable in size and/or shape to specific components of the integrated circuit, need to interface with specific materials, and need to be processed in a particular manner prior to and during testing.

One characteristic of a material that is important for many semiconductor applications is its electrical resistivity. Resistivity, which is also known as specific electrical resistance, is a measure of how strongly the material opposes the flow of an electric current through the material. Resistivity may be influenced by material composition, applied voltages (e.g., experience a breakdown), and other factors. Measuring resistivities of various materials, particularly nanoscale structures, may be important and difficult at the same time.

One specific example of a semiconductor device that is particularly sensitive to resistive characteristics of its components is a ReRAM cell. For example, embedding a resistor in series with other components of a ReRAM cell, such as a resistive switching layer, limits the current through the cell. This embedded resistor feature is used for controlling operations of the ReRAM cell and protecting it from being damaged.

For example, an embedded resistor formed into a square block of about 10-20 nanometers per side and a thickness of about 100 Angstroms may need to have a resistance of 100-200 kOhm. Furthermore, an embedded resistor should have a constant resistance over the entire operating voltage range of the ReRAM cell (e.g., up to 10 V). It has been found that some materials experience a break down such that their resistivities change in an abrupt manner upon reaching certain voltages.

To minimize the footprint of the ReRAM cell, the embedded resistor should be comparable in size to the rest of the components in the cell, e.g., electrodes and resistive switching layer. Specifically, the area of an embedded resistor in the wafer plane provided at the intersection of a crossbar array should be $4F^2$, with F representing a feature size. Another consideration is the thickness of the resistor. Additional description of embedded resistors is provided in U.S. patent application Ser. No. 13/353,000, entitled "NONVOLATILE MEMORY DEVICE HAVING A CURRENT LIMITING ELEMENT", filed on Jan. 18, 2012, which is incorporated herein by reference in its entirety for purposes of describing embedded resistors.

Test vehicles need to be specifically designed for testing various materials formed into samples, keeping in mind specific applications of these materials. For example, the contact interface provided by a test vehicle may need to be inert to avoid interfacial layer formation that may prevent accurate resistance measurements. Materials used for test vehicles should withstand processing conditions associated with forming test samples on the test vehicles. Furthermore, materials used for test vehicles should be easy to process. For example, thick layers of platinum (e.g., over 100 nanometers) may be difficult to etch. Yet another consideration for test vehicles is adherence of different layers to each other to avoid excessive resistance build-up within the vehicle. For example, ruthenium may have poor adhesion to some other commonly used materials.

Noble metals provide good contact surfaces but, as stated above, can be difficult to process and exhibit poor adhesion. Provided test vehicles include relatively thin layers (e.g., 70 nanometers or less) of noble metals that are easy to etch. Furthermore, the test vehicles include oxygen getter materials, such as titanium, that interface the noble metal layers. Such materials getter oxygen from adjacent layers and serve as adhesion layers. These layers are formed at specifically controlled conditions to avoid excessive oxidation of these layers during processing. Specifically, deposition of the adhesion layer may be followed by deposition of the noble metal layer in the same processing chamber and without breaking the vacuum in the chamber.

The test vehicles described herein may be used for resistance testing of various integrated circuit components, such as embedded resistors of ReRAM cells. In some embodiments, a test vehicle includes two stacks protruding through an insulating body. Bottom ends of these stacks may be formed from n-doped poly-silicon. These ends are interconnected by a connector. Each stack may include a titanium nitride layer provided over the poly-silicon end, a titanium layer provided over titanium nitride layer, and a noble metal layer provided over the metallic titanium layer.

The titanium layer serves as an adhesion layer and oxygen gettering layer at the same time. Because of the oxygen sensitivity of this layer, it may be formed in-situ with the noble metal layer such that the titanium layer is not exposed to the ambient environment during or after fabrication of the test vehicle. The noble metal layer forms a contact surface. As such, the vehicle includes two contact surfaces, one for each stack. One contact surface may be used for receiving a test sample, while another may be used as for making another electrical connection to the vehicle. Both connections may be provided by contact pads, one contact pad deposited over the test sample, while the other contact pad deposited directed over the remaining contact surface.

Combinatorial Examples

Before describing various test vehicles and methods of using thereof, a brief description of HPC processing, in general, and HPC physical vapor deposition (PVD) processing, in particular, will be provided. FIG. 1A illustrates a schematic diagram 100 for implementing combinatorial processing and evaluation using primary, secondary, and tertiary screening, in accordance with some embodiments. Schematic diagram 100 shows that the relative number of combinatorial processes runs with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during materials discovery stage 102, which is also known as a primary screening stage and is performed using primary screening techniques. Primary screening techniques may include dividing substrates into coupons or site isolation regions and depositing same or different materials using varied processes described elsewhere in this document. The materials are then evaluated, and promising candidates are advanced to the secondary screen stage or materials and process development stage 104. Evaluation of the materials produced at each stage may be performed using metrology tools, such as electronic testers and imaging tools.

Materials and process development stage 104 may be used to evaluate hundreds of materials (i.e., a magnitude smaller than the primary stage) and may focus on the processes used to deposit or develop those materials. HPC techniques allow processing many of these materials in parallel on the same substrate substantially reducing efforts and increasing testing throughputs. Furthermore, multilayered structures may be formed in situ without cumbersome transfer of substrate between multiple different processing apparatuses. Promising materials and processes are again selected and advanced to a tertiary screen stage or process integration stage 106 where tens of materials and/or processes and combinations are evaluated. This tertiary screen stage may focus on integrating the selected processes and materials with other processes and materials. Again, HPC techniques provide significant advances over conventionally used process at this and other stages of the overall process.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

Schematic diagram 100 is just one example of various techniques that may be used to evaluate and select materials and processes for the development of new materials and processes. The above description of primary, secondary and other screening levels are arbitrary. Processes involve in each stage may overlap, occur out of sequence, be described and be performed in many other ways.

Some aspects of HPC techniques are further described in U.S. patent application Ser. No. 11/674,137 filed on Feb. 16, 2007, which is hereby incorporated by reference in its entirety for purposes of describing HPC techniques. Application of combinatorial techniques allows various testing integration in order to arrive at a globally optimal sequence of semiconductor devices, thin film photovoltaic (TFPV) modules, optoelectronic devices, and the like. Furthermore, these techniques allow development of manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor devices, TFPV modules, optoelectronic devices, and other like devices. A global optimum sequence order is, therefore, derived and as part of implementation of these techniques.

Figure 1B:
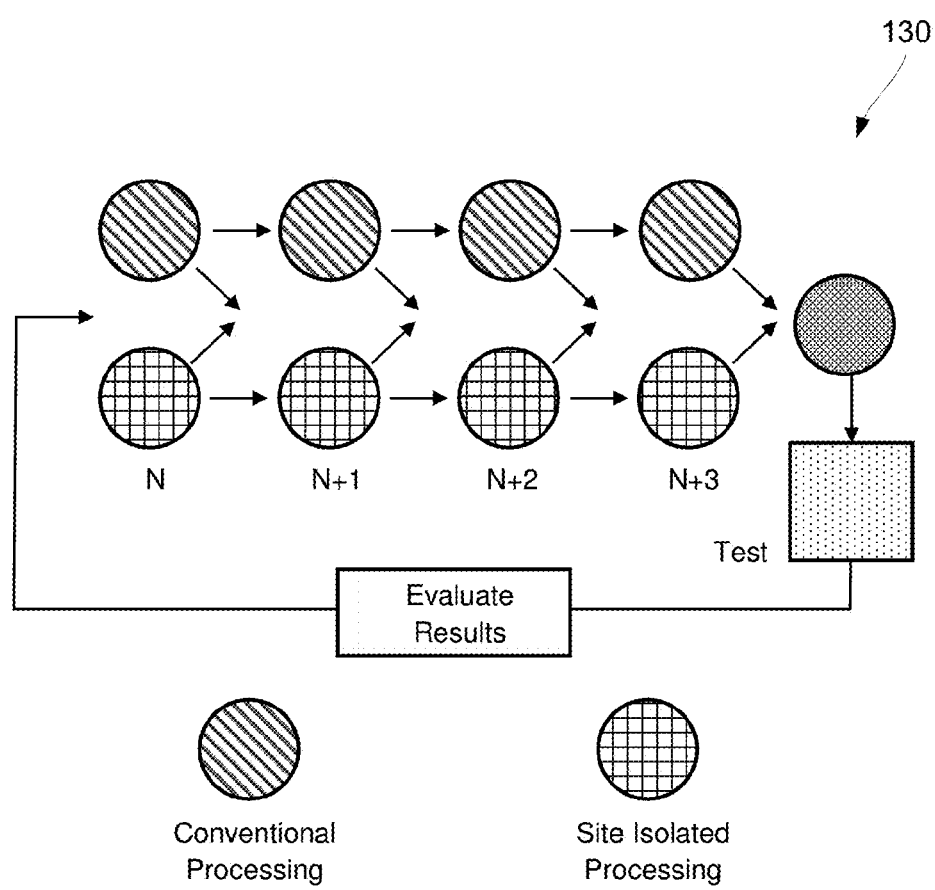
FIG. 1B illustrates a schematic diagram representing a general methodology for combinatorial process sequence integration involving site isolated processing and/or conventional processing, in accordance with some embodiments.

FIG. 1B is a simplified schematic diagram illustrating a general methodology for combinatorial process sequence integration that includes site isolated processing and/or conventional processing in accordance with one embodiment. In some embodiments, the substrate is initially processed using conventional process N. The substrate may be then processed using site isolated process N+1. During site isolated processing, an HPC system may be used, some examples of which are further described below. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor device, TFPV module, optoelectronic device, etc. manufacturing may be varied.

Examples of Test Vehicles

One or more test vehicles may be provided on a substrate. When multiple test vehicles are provided on the same substrate, some of these test vehicles may be the same, while others may be different. For example, different test vehicles may include connectors having different resistances. Furthermore, test vehicles may differ based on the sizes of their contact surfaces. Other components of these test vehicles may be the same or similar (from one vehicle to another).

Multiple test vehicles provided on the same substrate may be grouped according to their characteristics. These groups may be used to test the same or different materials. For example, testing methodology using High Productivity Combinatorial (HPC) may be applied for testing multiple different materials. In some embodiments, the same substrate may be used for testing different materials that may be candidates for a ReRAM embedded resistor. Arrangement of test vehicles on the substrate and specific components of test vehicles will now be explained with reference to FIGS. 2A-2E.

Figure 2A:
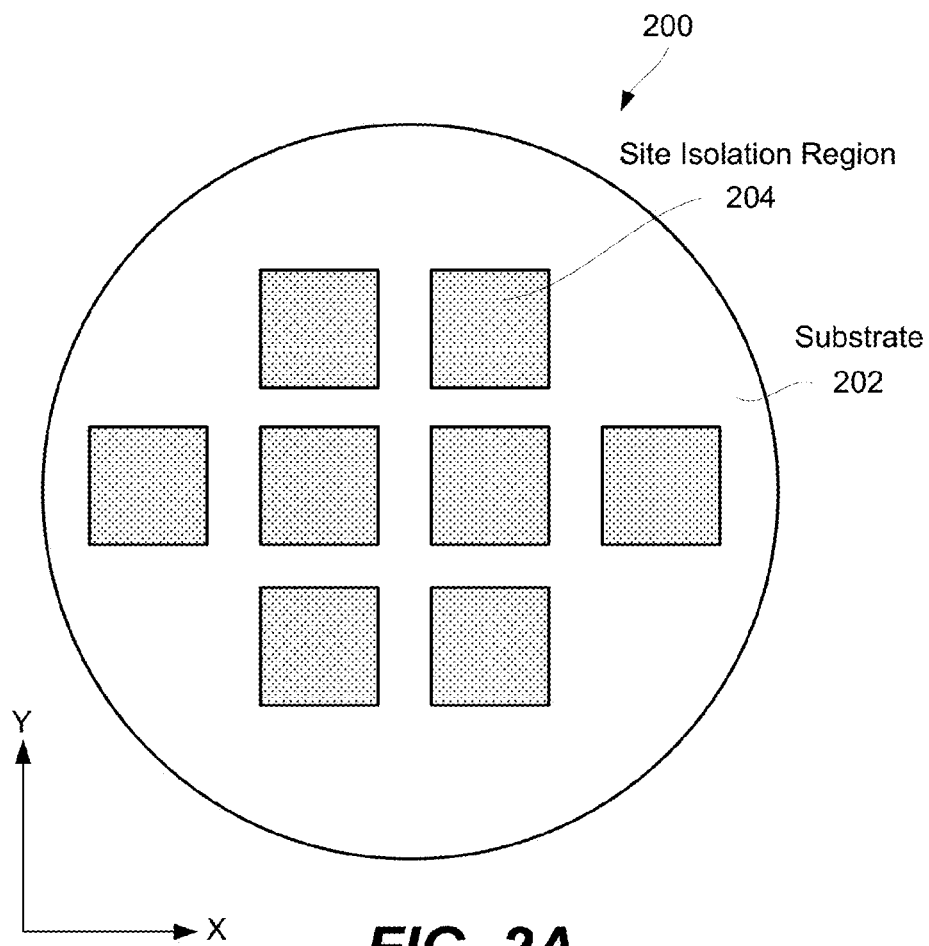
FIG. 2A illustrates a schematic representation of a substrate having eight site isolation regions, in accordance with some embodiments.
Figure 2B:
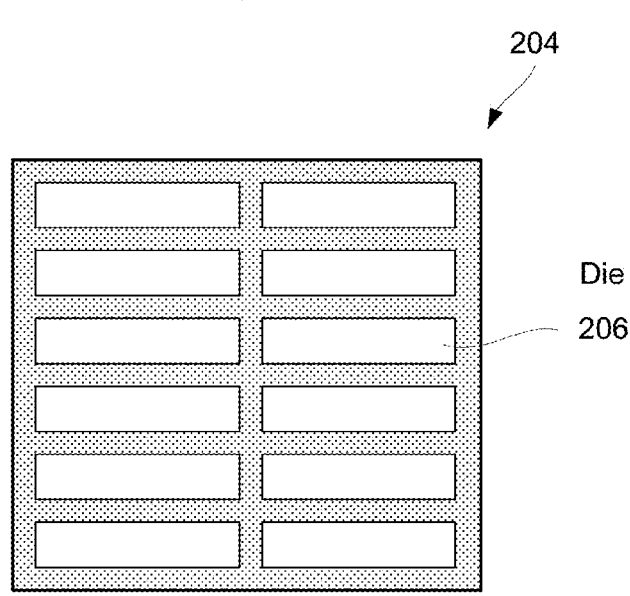
FIG. 2B illustrates a schematic representation of a site isolation regions having twelve dies, in accordance with some embodiments.

FIG. 2A illustrates a schematic representation of a substrate 202 having eight site isolation regions 204, in accordance with some embodiments. In general, any number of site isolation regions may be provided on the same substrate. Site isolation regions 204 may have a rectangular, square, round, or any other shape. A dimension of each site isolation region 204 (e.g., a length of the side in a square or a diameter in a circle) may be between about 20 mm and 100 mm, such as about 45 mm. Each one of site isolation regions 204 may include multiple dies 206 as shown in FIG. 2B. For example, a site isolation region may include twelve dies or any other number of dies. Each die 206 may include multiple test chips, e.g., three test chips 208a-208c, as shown in FIG. 2C.

Test vehicles included in these test chips 208a-208c may vary from one test chip to another. The difference may be in a form of connector resistances. For example, all test vehicles of test chip 208a may have the same resistance of their connectors. However, this resistance may be different from the resistance of connectors used in test vehicles of test chip 208b. Furthermore, the resistance of connectors used in test vehicles of test chip 208c may be still different from ones used in chips 208a and 208b. In a specific example, the resistance of a connector provided on one test chip may be about 9 kOhm (e.g., 9+/−1 kOhm), the resistance of each connector provided on another test chip may be about 62 kOhm (e.g., 62+/−1 kOhm), and the resistance of each connector provided on yet another test chip may be about 116 kOhm (e.g., 116+/−1 kOhm). When testing resistive switching materials, such as metal oxides, the resistors provide passive current suppression to modulate the programmed resistance of the LRS. All these test chips may be a part of the same die. Other resistance values and configurations of test chips may be used as well. In some embodiments, one of these resistance values may be substantially the same as resistance of the resistive switching layer in its LRS, e.g., the 116 kOhm value resulting in the total stack resistance of about 200 kOhm. In other words, a load resistor may be chosen to simulate operating conditions.

Figure 2C:
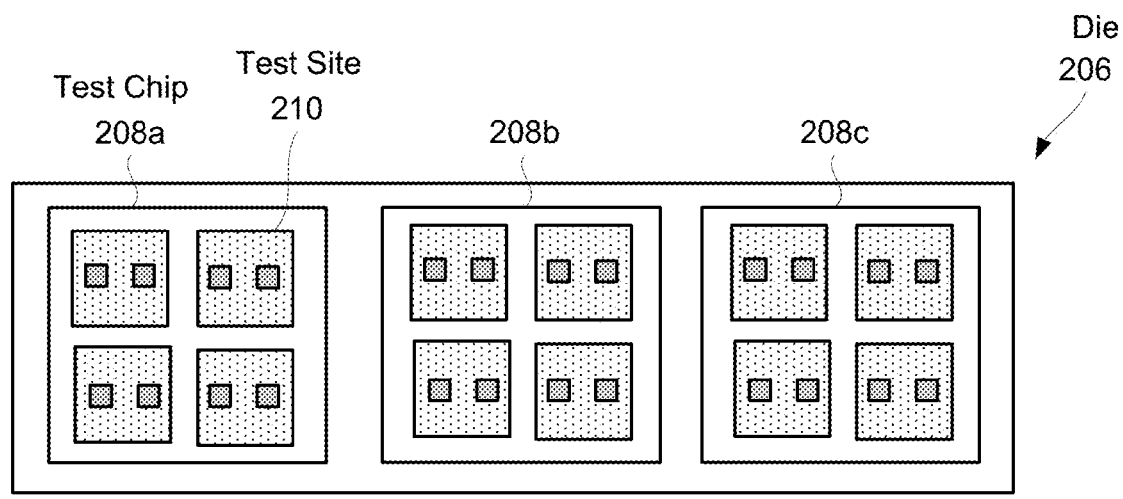
FIG. 2C illustrates a schematic representation of a dies having three test chips, each test chip including four test sites, in accordance with some embodiments.

Each test chip may include multiple test sites 210 as, for example, shown in FIG. 2C. Each test site may contain one or more test vehicles. In some embodiments, test vehicles provided at different test sites may differ from each other in terms of their contact surface areas. This variation may apply only to one of the two contact surfaces of each test vehicle. For example, only contact surfaces that are configured to receive test materials may vary in size from one test site to another, while their counterpart contact surfaces that directly interface with the contact pad may have the same contact surface areas among multiple test sites. In some embodiments, the varied contact surfaces may be about 130 nanometers in size in one test site, about 150 nanometers in size in another site, about 350 nanometers in size in yet another site, and about 500 nanometers in size for another site. These sizes may represent side lengths of square contact areas, in some embodiments. Other sizes, shapes, and configurations of contact surface may be used as well.

It should be noted that each test vehicle includes two contact surfaces. One contact surface later receives a test material in a form of a test sample (formed from a test material) and therefore may be referred to as a sample contact surface. Usually, the sample is larger than this contact surface. As such, the size of this contact surface determines the interface area with the sample. The other contact surface generally does not receive any test materials and therefore may be referred to a non-sample contact surface.

Figure 2D:
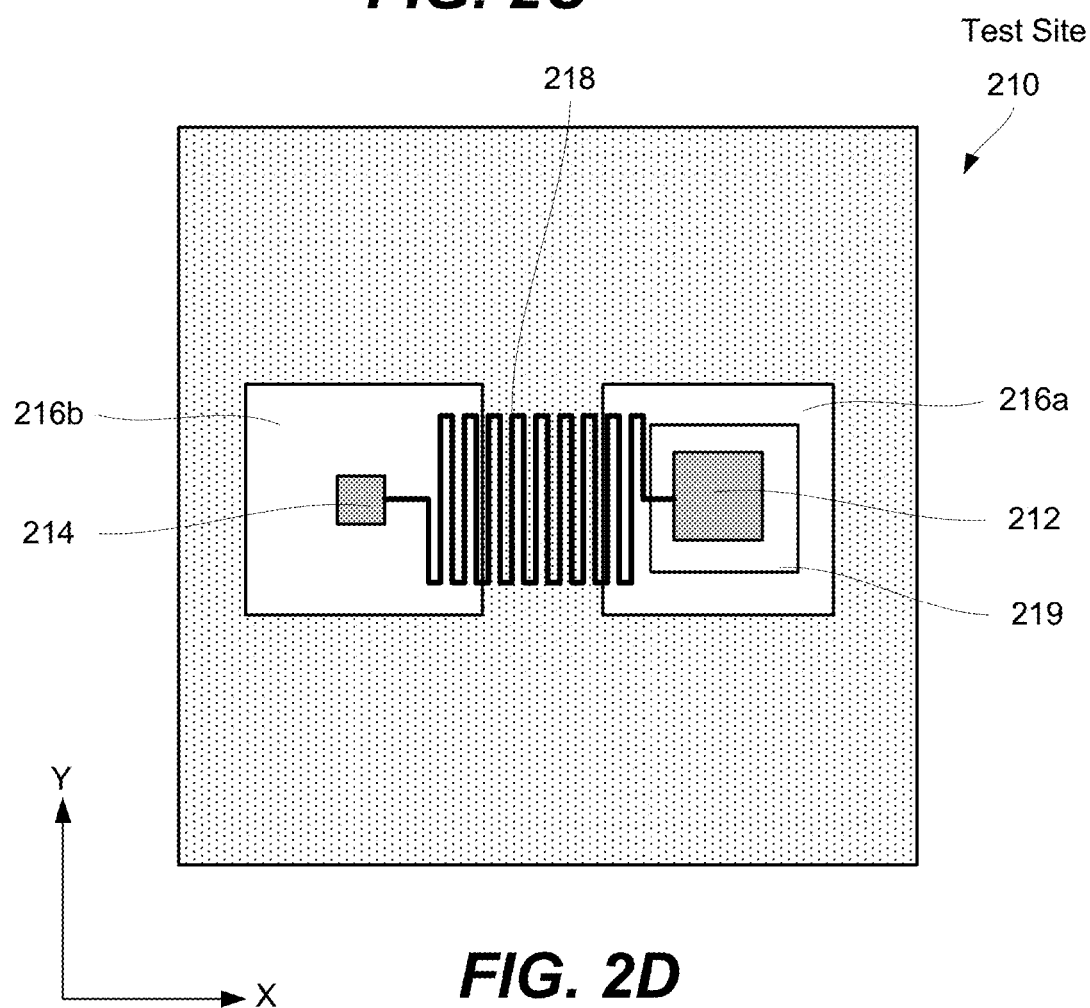
FIG. 2D illustrates a schematic top view a test site illustrating various components of a test vehicle provided on the test site, in accordance with some embodiments.

FIG. 2D illustrates a schematic top view of test site 210 including a test vehicle showing two contact surfaces 212 and 214 each corresponding to a separate stack and connector 218 provided between the two stacks, in accordance with some embodiments. Connector 218 may have a wavy (e.g., square wave) shape in order to increase its length and, as a result, resistance. Connector 218 makes electrical connections to bottom portions of each stack.

FIG. 2D also illustrates two contact pads 216a and 216b provided over contact surfaces 212 and 214. A test sample 219 is positioned in between contact pad 216a (i.e., sample contact pad) and corresponding contact surface 212 (i.e., sample contact surface). Another contact pad 216b (i.e., sample-free contact pad) may directly interface contact surface 214 (i.e., sample-free contact surface). Contact pads 216a and 216b may be made from a conductive material, such as n+ polysilicon, TiN, TaN, TaSiN, TiSiN, Jr, Pt, Au, Ag, TaAlN, and TiAlN. The size of contact pads 216a and 216b in the X-Y plane is generally much greater the size the contact surfaces 212 and 214. The larger size is used to provide electrical connections to measuring probes.

The size of test sample 219 in the X-Y plane is greater than sample contact surface 212. As such, the area of sample contact surface 212 controls the conductivity at this interface and is used for calculating the resistivity of the tested material.

Figure 2E:
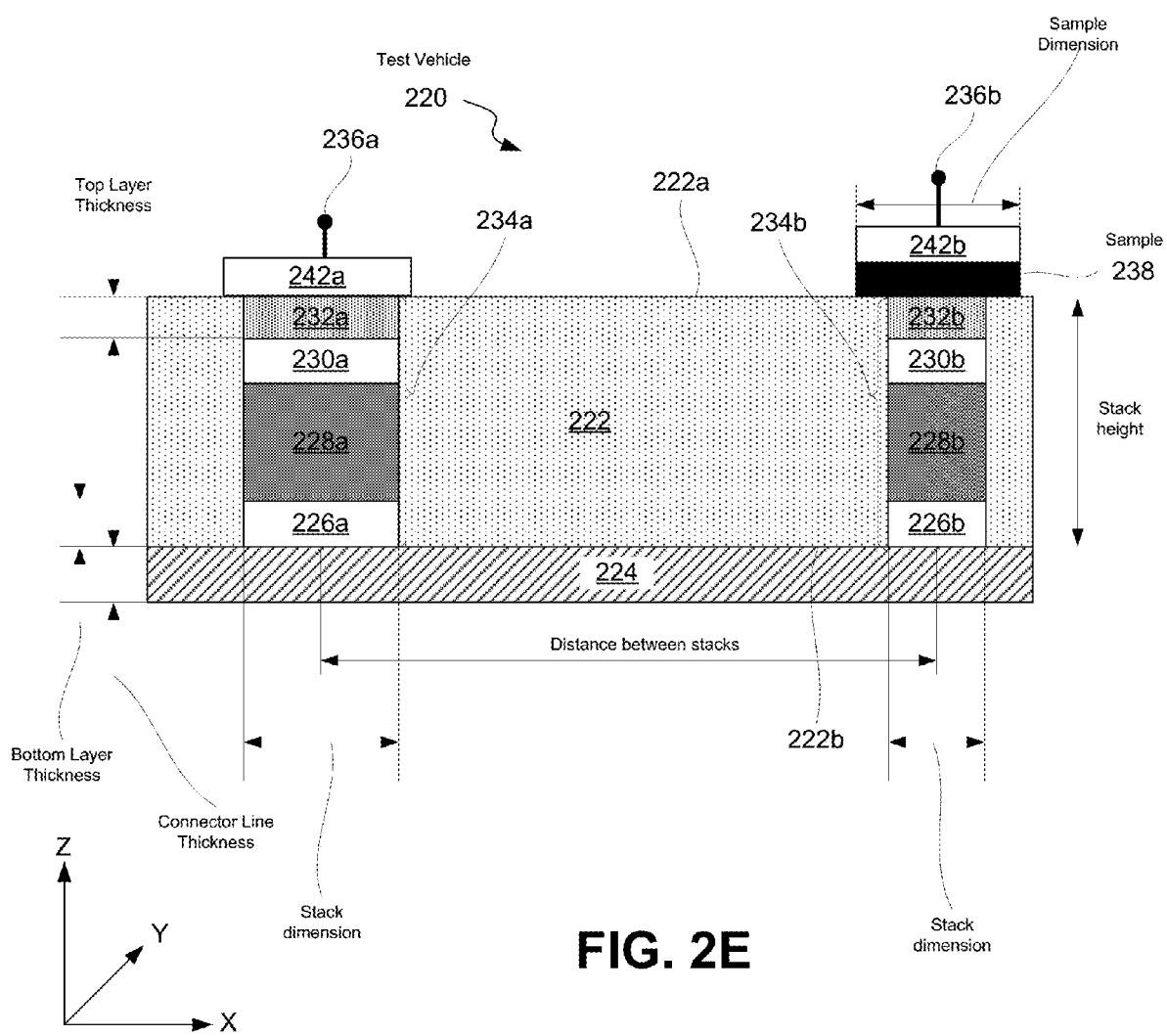
FIG. 2E illustrates a schematic cross-sectional representation of a test vehicle, in accordance with some embodiments.

FIG. 2E illustrates a schematic cross-sectional side view of test vehicle 220, in accordance with some embodiments. Test vehicle 220 includes a connector 224 made from a conductive material. Some examples of suitable conductive materials include tungsten, copper, aluminum, silver, gold, manganin, constantan, and other materials that have a relatively low temperature coefficient of resistivity. This characteristic helps maintaining a constant resistance over a wide temperature range, which enhances the utility of the testing vehicle. Connector 224 extends between stacks 234a and 234b. In some embodiments, the distance between stacks 234a and 234b is between about 1 micrometer and 100 micrometers or, more specifically, between about 10 micrometers and 50 micrometers. This distance is measured between centers of stacks 234a and 234b. The distance may be specifically selected to provide sufficient space for contact pads 242a and 242b and achieve certain resistance of connector 224.

Connector 224 makes electrical connections to bottom layers 226a and 226b of stacks 234a and 234b. Materials and geometry of connector 224 are specifically selected to achieve a specific resistance of connector 224 between layers 226a and 226b. This resistance may be between about 5 kOhm and 122 kOhm, such as about 9 kOhm, about 62 kOhm, or about 116 kOhm. Other resistance values may be used as well.

In some embodiments, connector 224 is specifically shaped in the X-Y plane (as, e.g., illustrated in FIG. 1D) to achieve a desired resistance of connector 224. The thickness of connector 224 may be between about 100 Angstroms and 1,000 Angstroms depending on the desired resistance. The thickness and total length of the connector (effectively, the volume) determines the resistance of the connector. Connector 224 may be provided within a substrate (not shown in FIG. 2). The substrate may be made from a material such as doped or undoped silicon. For example, silicon with 1,000 Angstroms to 3,000 Angstroms of thermal oxide may be used.

Stacks 234a and 234b extend through a body 222 made from an insulating material. Some examples of suitable insulating materials for body 222 include silicon dioxide and silicon nitride. The height of stacks 234a and 234b may be substantially the same as the thickness of body 222. In some embodiments, this thickness may be between about 0.1 micrometers and 5 micrometers or, more specifically, between 0.2 micrometers and 1 micrometer. This thickness should be sufficient to accommodate all layers of stacks 234a and 234b. Body 222 includes top surface 222a and bottom surface 222b. Top surface 222a is used for depositing test sample 238 and contact pads 242a and 242b. Top surface 222a of body 222 may coincide with contact surfaces formed by top layers 232a and 232b.

Both stacks 234a and 234b may have the same or similar sets of layers. Each corresponding pair of layers (e.g., layers 226a and 226b or layers 228a and 228b) may have the same composition and thickness (measured in the Z direction). However, these corresponding pairs may have different dimensions measured in the X-Y plane, i.e., the plane perpendicular to the height of stacks 234a and 234b. The composition and thickness similarities may result from both stacks being formed from the same sets of layers as further described below by etching portions of the layers around the stacks. The dimensions may vary due to testing requirements. For example, specific dimensions may be used to achieve particular areas of contact surfaces formed by top layers 232a and 232b as described above.

One stack 234b is used to receive and make an electrical connection to test sample 238 and may be called a sample stack. The other stack 234a does not include a sample and makes an electrical connection directly to contact pad 242a and may be called a non-sample stack. In some embodiments, both stacks 234a and 234b have square profiles (in the X-Y plane). The size of this profile (i.e., length of the side if the square) of the sample stack may be between about 100 nanometers and 600 nanometers, such as about 130 nanometers, 150 nanometers, 350 nanometers, or 500 nanometers. Other shapes can be used as well, such as a rectangular shape or a circular shape having comparable dimensions in that plane. In some embodiments, the non-sample stack should have a footprint of at least 40 micrometers for reliable contacting with a probe tip. In some embodiments, the footprint is under 100 micrometers for efficient space utilization, e.g., about 70 micrometers.

Composition and thickness of each layer in stacks 234a and 234b will now be described. Since both stacks may have corresponding layers that only differ in dimensions in the X-Y plane and have the same compositions and thicknesses, the reference will only be made to the layer of stack 234a. The bottom layer 226a may be formed from n-doped polysilicon or other suitable materials, such as aluminum, titanium, and chromium. The thickness of bottom layer 226a may be thin enough to form adhesion (e.g., about 50 Angstroms to 1200 Angstroms depending on how many layers there are). If another layer is built on top of layer 226a, then it can be thinner than of a single layer is used. The overall stack thickness may be less than 1500 Angstroms to make it easier to etch. In some embodiments, bottom layer 226a directly interfaces connector 224 and forms electrical connection to this layer 224. This layer provides a adhesive contact to the underlying tungsten layer. Layer 228a may be provided above bottom layer 226a. Layer 228a may be formed from titanium nitride or other suitable materials.

Layer 230a may be provided above layer 228a and may be formed from titanium or other suitable oxygen getter materials, such as aluminum, titanium, and chromium. The thickness of layer 230a may be between about 20 Angstroms and 70 Angstroms, such as about 50 Angstroms. Layer 230a acts as an adhesion layer for two adjacent layers 228a and 232a, in particular layer 232a, which is formed from a noble metal. Furthermore, titanium prevents oxidation of materials in layer 228a by being more reactive. The amount of oxidation of layer 230a during its formation is minimized by forming layers 230a and 232b in situ and without breaking vacuum during and in between these operations.

Top layer 232a, which may be referred to as a first layer, may be provided above layer 230a and may be formed from a noble metal, such as platinum, iridium, or ruthenium. The thickness of layer 232a may be between about 20 Angstroms and 70 Angstroms, such as about 50 Angstroms. Top layer 232a forms a contact surface that is used for making electrical connections. Specifically, top layer 232a receives contact pad 242a over its contact surface, while top layer 232b receives sample 238 and then contact pad 242b over its contact surface. It should be notes that test vehicle 220 provides electrical continuity between its two contact surfaces through its two stacks 234a and 234b and connector 224. In some embodiments, some of the above mentioned layers may be absent from stacks 234a and 234b. Furthermore, other layers may be provided within stacks 234a and 234b.

As stated above, contact pads 242a and 242b may be formed directly over the contact surface of non-sample stack 234a or over sample 238 formed over sample stack 234b. The dimension of contact pads (in the X-Y plane) may be between about 1 micrometer and 100 micrometers to ensure connection to probes 236a and 236b.

Test Vehicle Fabrication Examples

Figure 3:
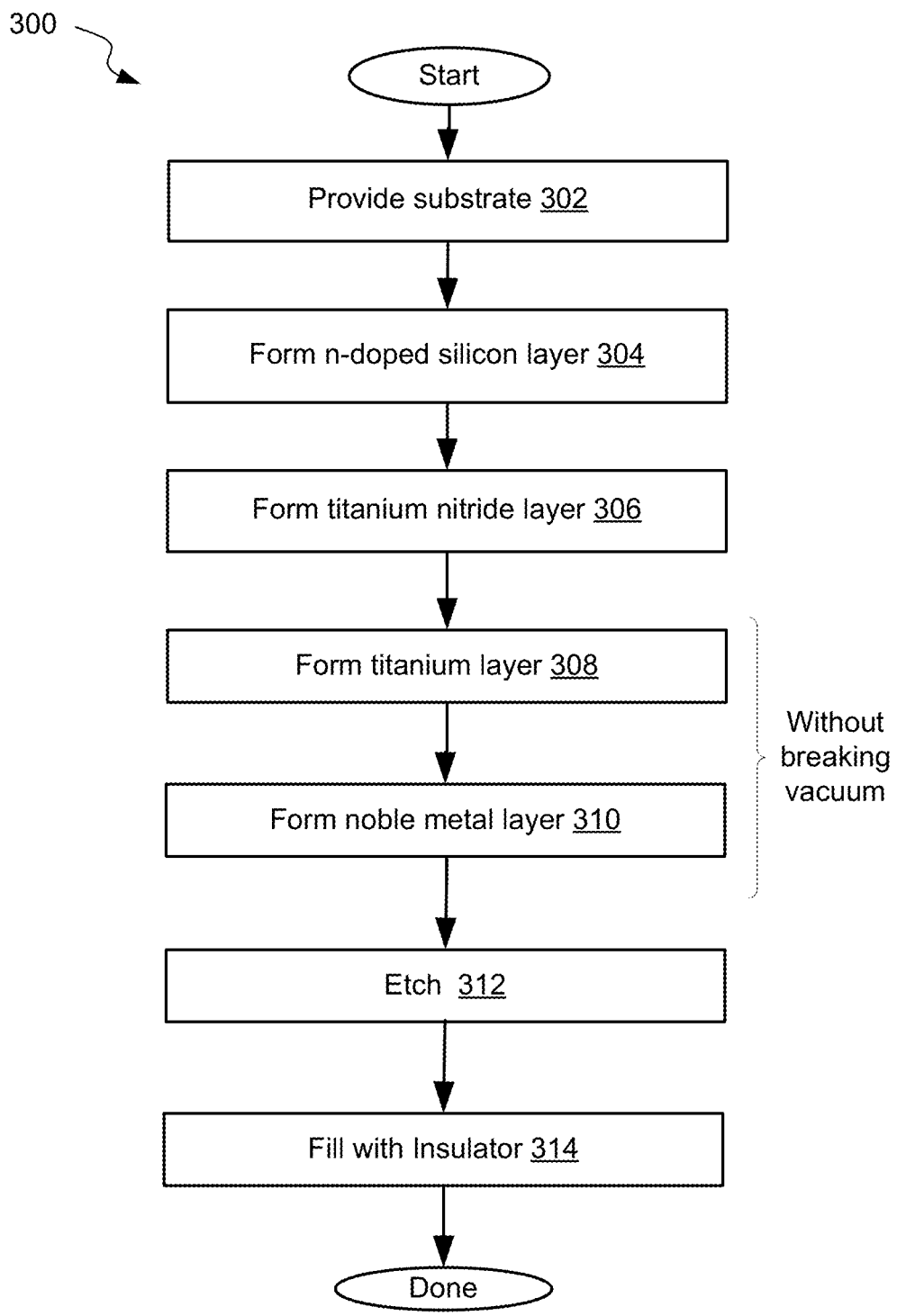
FIG. 3 illustrates a process flowchart corresponding to a method of fabricating a test vehicle, in accordance with some embodiments.

FIG. 3 illustrates a process flow chart corresponding to a method 300 of forming a test vehicle for evaluating resistance characteristics of a test sample, in accordance with some embodiments. Method 300 may commence with providing a substrate during operation 302. The substrate may include a connector. Various examples of substrates are presented above. Method 300 may proceed with forming an n-doped silicon layer during operation 304. This layer may be deposited directly over the substrate. The n-doped silicon layer may be deposited as a blanket film over the entire surface.

Method 300 may then proceed with forming a titanium nitride layer during operation 306. The titanium nitride layer may be formed directly over the n-doped silicon layer formed during operation 304 or some other layer. Method 300 may then proceed with forming a titanium layer during operation 308. The titanium layer may be formed directly over the titanium nitride layer formed during operation 306. Alternatively, another layer may be provided in between the titanium layer and titanium nitride layer.

Without breaking vacuum in the deposition chamber after deposition of the titanium layer, method 300 may proceed with forming a noble metal layer during operation 310. Avoiding introduction of oxygen into the processing chamber after forming the titanium layer and prior to capping it with the noble metal layer helps to prevent oxidation of the titanium layer and maintain its adhesion and oxygen getting properties.

Figure 4A:
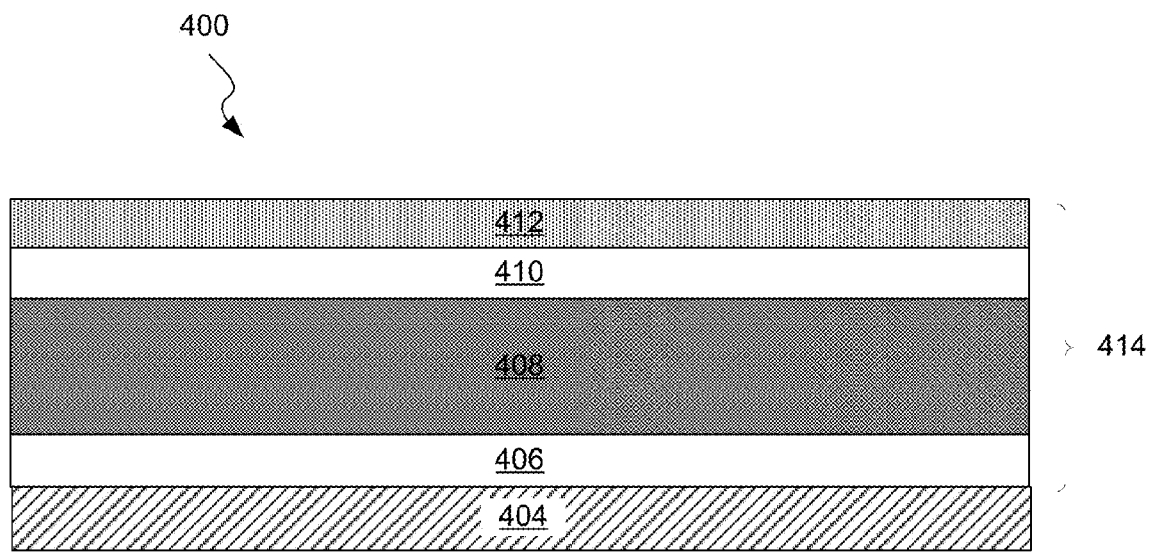
FIG. 4A-4C illustrates a schematic representation of a test vehicle during various stages of its fabrication, in accordance with some embodiments.

A schematic representation of a partially-fabricated test vehicle after operation 310 is illustrated in FIG. 4A. Specifically, partially-fabricated test vehicle 400 includes substrate 404, n-doped silicon layer 406 provided over connector 404, titanium nitride layer 408 provided over n-doped silicon layer 406, titanium layer 410 provided over titanium nitride layer 408, and noble metal layer 412 provided over titanium layer 410. It should be noted that partially-fabricated test vehicle 400 may include different layers, more layers, or fewer layers than illustrated in FIG. 4A and described above. The fact that all individual stacks are formed from the same combination of layers shown in FIG. 4A results in all individual stacks to have corresponding layer of the same thicknesses and composition.

Returning to FIG. 3, method 300 may proceed with etching a portion of the common stack leaving two individual stacks during operation 312. The remaining stacks can be patterned using e-beam. The resist is defined to remain on these features, with a strong sputter etch (e.g., Ar+) removing the rest of the field. In some embodiments, reactive etch may be used to remove portions of the stack. As noted above, other individual stacks of different test vehicles may be formed during this operation as well.

Figure 4B:
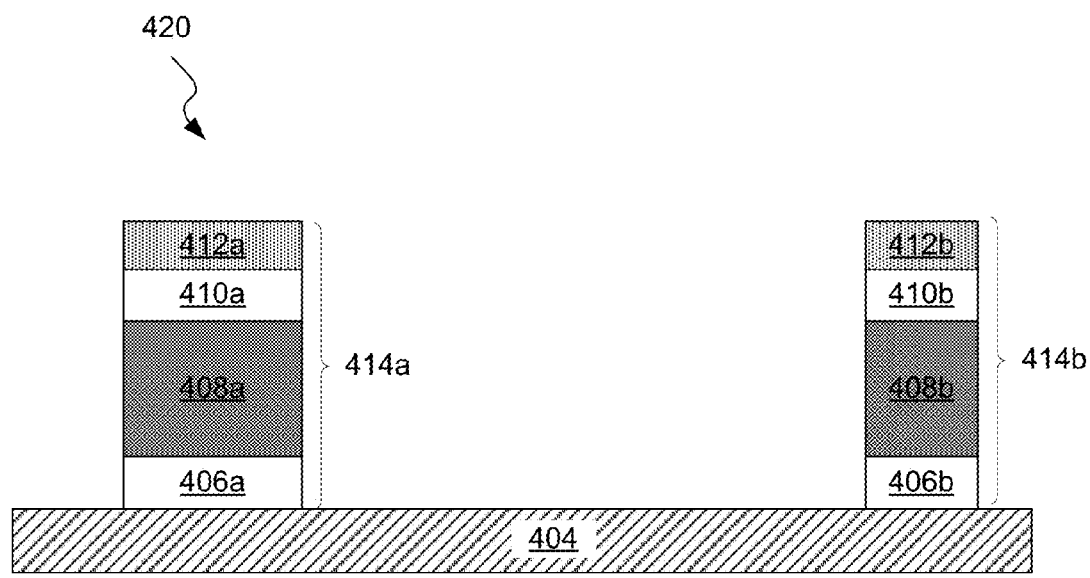

A schematic representation partially-fabricated test vehicle 420 after operation 312 is illustrated in FIG. 4B. This vehicle 420 includes individual stacks 414a and 414b. Each stack includes multiple layers, i.e., stacks 414a includes layers 406a-412a, while stack 414b includes layers 406b-412b. Each of these layers in the stacks represents portions of layers 406-412 shown in FIG. 4A. The etch pattern during operation 312 determines the area occupied by each of the stacks and defines the contact surfaces.

Figure 4C:
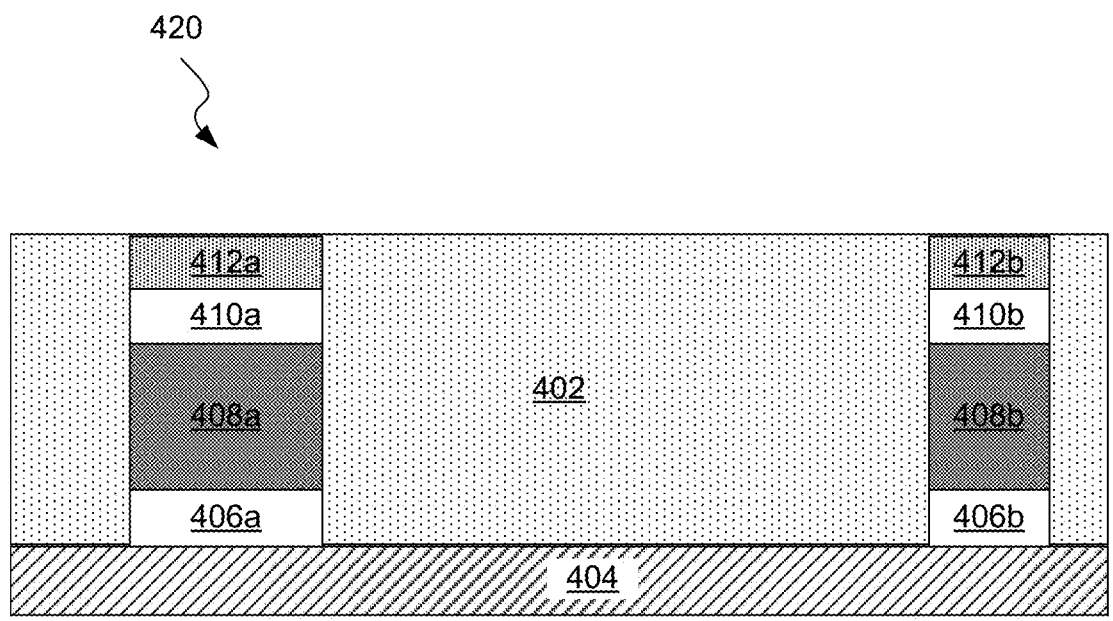

Returning to FIG. 3, method 300 may proceed with filling a space between the stacks with an insulating material, 402, during operation 314. The insulating material forms a body of the test vehicle, through which one or more pairs of stacks protrude. The assembly may be subjected to chemical-mechanical polishing (CMP), after which contact surfaces of all stacks are exposed. A fully fabricated test vehicle is shown in FIG. 4C.

Testing Examples

Figure 5:
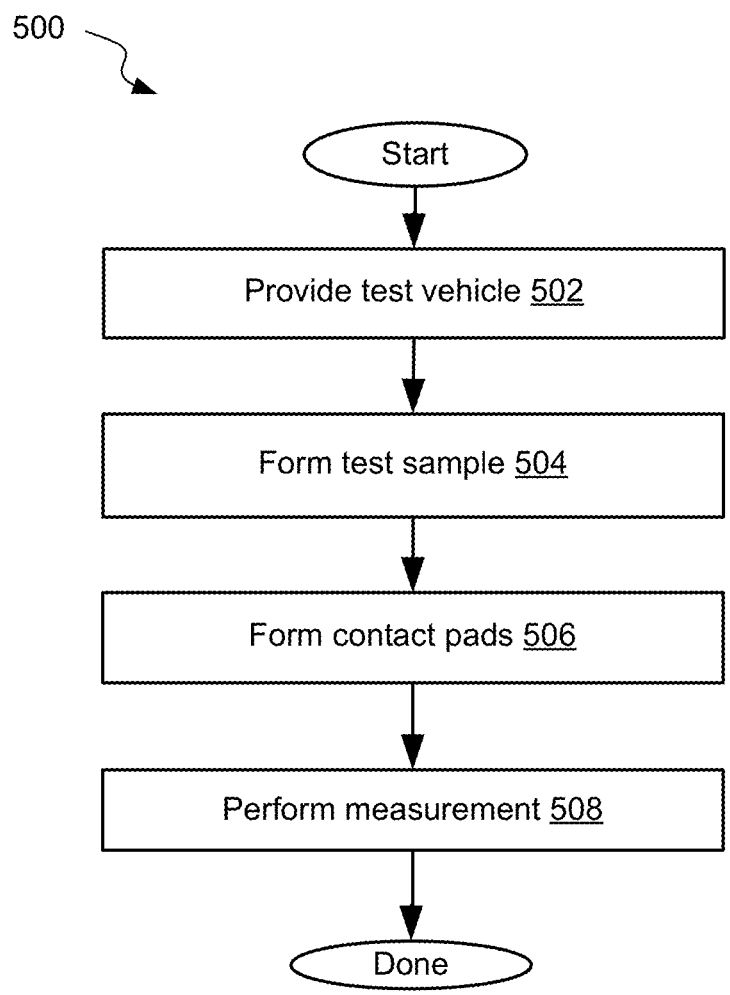
FIG. 5 illustrates a process flowchart corresponding to a method of testing the resistance of a sample using a test vehicle, in accordance with some embodiments.

FIG. 5 illustrates a process flowchart corresponding to a method 500 for testing resistance of a sample using a test vehicle, in accordance with some embodiments. Method 500 may commence with providing a test vehicle during operation 502. Various examples of test vehicles and methods of their fabrication are described above. The test vehicle may include two contact surfaces, one for receiving a test sample (and then a contact pad over the sample) and one for receiving a contact pad (without the sample).

Method 500 may proceed with forming a test sample (i.e. a test material) during operation 504. Various examples of test samples are provided in U.S. patent application Ser. No. 13/353,000, referenced above. One example of a test sample is TaSiN, deposited by PVD. The top electrode can be, e.g., TiN deposited by PVD. The patch is defined by standard lithography, which leaves photoresist on the patch to be defined and exposes the remaining surface to a strong sputter etch, e.g., Ar+. Method 500 may proceed with forming contact pads during operation 506. Both contact pads may be formed during this operation, i.e., one contact pad over the contact surface of the non-sample stack and the other contact pad over the test sample.

Method 500 may proceed with performing resistance measurements during operation 508. Agilent B1500 and/or Agilent 4156 SPA instruments may be used. In the case of embedded resistor testing, DC voltage sweeps or AC pulsing at constant voltage interspersed with a DC read operation at constant voltage, such as 0.5 V, may be performed.

Conclusion

Although the foregoing examples have been described in some detail for purposes of clarity of understanding, the invention is not limited to the details provided. There are many alternative ways of implementing the invention. The disclosed examples are illustrative and not restrictive.

What is claimed:
1. A die comprising:
    a portion of a substrate;
    a first test vehicle provided on the substrate and comprising two stacks,
        each stack comprising a first layer and a second layer,
        the first layer comprising a noble metal and forming a first contact surface,
        the second layer comprising titanium,
        the two stacks of the first test vehicle being interconnected by a first connector; and
    a second test vehicle comprising two stacks,
        each stack comprising a third layer and a fourth layer,
        the third layer is positioned within the same plane as the first layer and having the same composition as the first layer,
        the third layer forming a second contact surface,
        the fourth layer being positioned within the same plane as the second layer and having the same composition as the second layer, the two stacks of the second test vehicle being interconnected by a second connector.

2. The die of claim 1, wherein the first connector has a different resistance than the second connector.

3. The die of claim 1, wherein the first contact surface of the first test vehicle has a different area than the second contact surface of the second test vehicle.

4. The die of claim 1, wherein each of the first connector and the second connector comprises tungsten.

5. The die of claim 1, wherein each of the first connector and the second connector has a resistance of between 5 kOhm and 120 kOhm measured between the two stacks of each of the first test vehicle and the second test vehicle.

6. The die of claim 1, wherein a resistance of the first connector of the first test vehicle is different from a resistance of the second connector of the second test vehicle.

7. The die of claim 1, wherein the two stacks of each of the first test vehicle and the second test vehicle protrude through an insulating material comprising silicon dioxide.

8. The die of claim 1, wherein each stack of the first test vehicle comprises a titanium nitride layer disposed between the second layer and the first connector, wherein each stack of the second test vehicle comprises a titanium nitride layer disposed between the fourth layer and the second connector, and wherein the titanium nitride layer of the first test vehicle and the titanium nitride layer of the second test vehicle are positioned within the same plane.

9. The die of claim 8, wherein each stack of the first test vehicle comprises an n-doped polysilicon layer disposed between the titanium nitride layer and the first connector, wherein each stack of the second test vehicle comprises an n-doped polysilicon layer disposed between the titanium nitride layer and the second connector, and wherein the -doped polysilicon layer of the first test vehicle and the -doped polysilicon layer of the second test vehicle are positioned within the same plane.

10. The die of claim 1, wherein the first layer of the first test vehicle has a thickness of between 20 Angstroms to 70 Angstroms.

11. The die of claim 10, wherein the thickness of the first layer of the first test vehicle is same as a thickness of the third layer of the second test vehicle.

12. The die of claim 1, wherein the second layer of the first test vehicle has a thickness of between 20 Angstroms to 70 Angstroms.

13. The die of claim 12, wherein the thickness of the second layer of the first test vehicle is same as a thickness of the fourth layer of the second test vehicle.

14. The die of claim 1, wherein each stack of the first test vehicle and of the second test vehicle has a height of between 200 nanometers and 1,000 nanometers.

15. The die of claim 1, wherein the first contact surface of at least one stack of the first test vehicle has a dimension of between 100 nanometers and 600 nanometers within a plane perpendicular to the height of the stack.

16. The die of claim 1, wherein the two stacks of the first test vehicle are posited at a distance between 1 micrometer and 100 micrometers from each other.

17. The die of claim 1, further comprising a contact pad provided over the first contact surface of at least one stack of the first test vehicle, the contact pad being in electrical communication with the first contact surface, the contact pad having a dimension of between about 1 micrometer and 100 micrometers within a plane of the substrate.

18. The die of claim 1, further comprising a first test sample and a second test sample, wherein the first test sample comprises a first test material and is disposed over the first contact surface of at least one stack of the first test vehicle, wherein the second test sample comprises a second test material and is disposed over the second contact surface of at least one stack of the second test vehicle, wherein the first test sample is in electrical communication with the first contact surface, and wherein the second test sample is in electrical communication with the second contact pad.

19. The die of claim 18, wherein the first material is different from the second material.

20. The die of claim 18, wherein the first test sample has a different resistance than the second test sample.

* * * * *